United States Patent
Lim

[11] Patent Number: 6,018,176
[45] Date of Patent: Jan. 25, 2000

[54] VERTICAL TRANSISTOR AND MEMORY CELL

[75] Inventor: Byung-hak Lim, Anyang, Rep. of Korea

[73] Assignee: SamSung Electronics Co., Ltd., Kyungki-do, Rep. of Korea

[21] Appl. No.: 08/925,394

[22] Filed: Sep. 8, 1997

Related U.S. Application Data

[62] Division of application No. 08/653,613, May 24, 1996, Pat. No. 5,707,885.

[30] Foreign Application Priority Data

May 26, 1995 [KR] Rep. of Korea ............ 95-13443

[51] Int. Cl.[7] ................. H01L 27/108; H01L 29/76
[52] U.S. Cl. ................. 257/302; 257/296; 257/329; 257/71
[58] Field of Search ................. 257/60, 71, 74, 257/135, 136, 278, 296, 302, 328, 329, 347, 350; 438/155, 156, 192, 149

[56] References Cited

U.S. PATENT DOCUMENTS 5,561,308 10/1996 Kamata et al. ............ 257/329

FOREIGN PATENT DOCUMENTS 403270265A 12/1991 Japan.

Primary Examiner—T. Thomas
Assistant Examiner—Hung Kim Vu
Attorney, Agent, or Firm—Skjerven, Morrill, MacPherson Franklin & Friel LLP; David T. Millers

[57] ABSTRACT

A method for manufacturing a three-dimensionally structured vertical transistor or memory cell forms a silicon-on-insulator (SOI) structure on a semiconductor substrate and sequentially deposits a drain region, a channel region and a source region on the SOI substrate structure. The transistor includes a cylinder-type gate insulation layer surrounding the channel region and a gate electrode surrounding the gate insulation layer, having increased integration. This process and structure avoid the characteristic degradation caused by the leakage current associated with the trench process and structure.

16 Claims, 3 Drawing Sheets

VERTICAL TRANSISTOR AND MEMORY CELL

This is a divisional of application Ser. No. 08/653,613, filed May 24, 1996, now U.S. Pat. No. 5,707,885.

BACKGROUND OF THE INVENTION

The present invention relates to a vertical transistor and a method for manufacturing the same, and more particularly, to a vertical transistor in which integration is improved and leakage current is greatly reduced.

Along with the increased integration of semiconductor devices, for example, 1 Gbit DRAMs and beyond, new techniques for manufacturing extremely small transistor elements must be developed. One method of increasing integration is to form a three-dimensional transistor structure, instead of the commonly used planar-type transistor. A three-dimensionally structured transistor having a cylindrical gate electrode has been proposed by H. Takato et al. in a paper entitled "Impact of Surrounding Gate Transistor (SGT) for Ultra-high Density LSI's" (*IEEE Transactions on Electron Devices*, March 1991, pp.573–577).

FIG. 1 is a section view of the above three-dimensionally structured transistor. Here, reference numeral 10 denotes a semiconductor substrate, reference numeral 12 denotes a first-conduction-type well having convex and concave areas formed by a trench region, reference numeral 14 denotes a gate insulation layer formed in well 12, reference numeral 16 denotes a polysilicon gate electrode on the surface of gate insulation layer 14 formed on the inner sidewalls of well 12, reference numeral 18a denotes a source region of a second conduction type which is different from the first conduction type, reference numeral 18b denotes a second-conduction-type drain region, reference numeral 20 denotes an insulation layer having a contact hole on source region 18a and drain region 18b, and reference numerals 22a and 22b denote a source electrode and a drain electrode connected to source region 18a and drain region 18b, respectively.

According to the above structure, in order to form a channel region between the source and drain of the transistor, a deep trench is formed in a well. Here, the side and bottom surfaces of the trench are damaged during its formation, and the damage has significant adverse effects on the subsequently formed gate insulation layer, channel region and source/drain region, thus causing leakage current. Further, if the transistor of FIG. 1 is employed as an access transistor of a DRAM cell, the process margin for forming a contact hole to connect the source region and the storage electrode is very small. Moreover, a bit-line and bit-line contact are necessarily formed on the drain, which complicates the manufacturing process.

SUMMARY OF THE INVENTION

Accordingly, it is an object of the present invention to provide a vertical transistor for reducing a leakage current and improving process margin by forming a self-aligned contact hole on a source region and a drain region.

It is another object of the present invention to provide a method for manufacturing the vertical transistor.

To accomplish the above object, there is provided a vertical transistor comprising: a first insulation layer and a first conductive layer sequentially formed on a semiconductor substrate; a second insulation layer pattern which has a first contact hole and is formed on the first conductive layer; a gate electrode formed of a second conductive layer which exposes the bottom of the first contact hole and has a hole whose diameter is greater than that of the first contact hole on the second insulation layer pattern around the first contact hole; a third insulation layer pattern formed on the gate electrode having a second contact hole of the same size as the first contact hole in order to expose the bottom of the first contact hole; a gate insulation layer which is formed of a fourth insulation layer, on a hole sidewall of the gate electrode; a drain region which is formed of a first portion of a third conductive layer pattern that contacts the first conductive layer, in the first contact hole formed by the second insulation layer pattern; a channel region which is formed of a second portion of the third conductive layer pattern that contacts the drain region, in the hole formed by the gate insulation layer; and a source region formed of a third portion of the third conductive layer pattern that contacts the channel region, in the second contact hole formed by the third insulation layer pattern.

To accomplish another object of the present invention, there is provided a method for manufacturing the vertical transistor comprising the steps of: sequentially forming a first insulation layer, a first conductive layer and a second insulation layer all over a semiconductor substrate; forming a second conductive layer pattern on a predetermined region of the second insulation layer; forming a third insulation layer all over the semiconductor substrate where the second conductive layer pattern is formed; forming a photoresist pattern so as to expose the third insulation layer on the center of the second conductive layer pattern; sequentially etching the third insulation layer, second conductive layer pattern and second insulation layer by using the photoresist pattern as an etching mask so as to form a third insulation layer pattern, a second conductive layer pattern and a second insulation layer pattern each of which has a hole; isotropically etching a hole sidewall of the second conductive layer pattern by a predetermined thickness so as to form a gate electrode; removing the photoresist pattern; forming a gate insulation layer formed of a fourth insulation pattern, on an inner sidewall of the gate electrode; forming a drain region formed of a first portion of the third conductive layer pattern that contacts the first conductive layer, in the hole formed by the second insulation layer pattern; forming a channel region formed of a second portion of the third conductive layer pattern that contacts the drain region, in the hole formed by the gate insulation layer; and forming a source region formed of a third portion of the third conductive layer pattern that contacts the channel region, in the hole formed by the third insulation layer pattern.

According to the present invention, a three-dimensionally structured transistor having a gate electrode, a gate insulation layer surrounding a channel region and a structure that a drain region, a channel region, and a source region are sequentially deposited is formed without using a trench process on a silicon-on-insulator (SOI) substrate structure consisting of a semiconductor substrate, a first insulation layer and a first conductive layer, preventing leakage current caused by the trench process. In addition, a well formation process and an isolation process for separating the device are not needed, which simplifies the process. In addition, a semiconductor device comprising the above transistor can be formed on the SOI substrate structure. As a result, the soft error rate is greatly reduced, thus improving the reliability of the semiconductor device and greatly reducing or eliminating the latch-up phenomenon.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The vertical transistor of the present invention is structured as follows.

Figure 1:
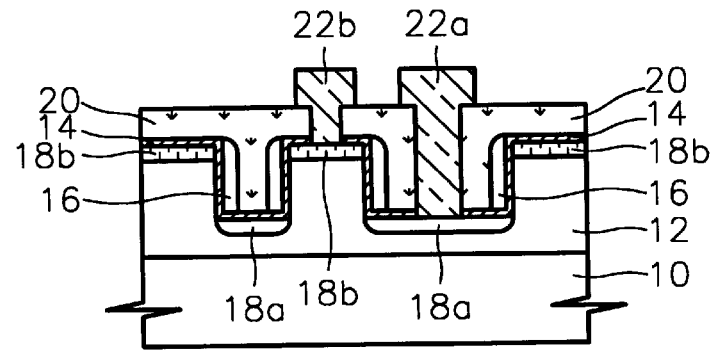
FIG. 1 is a section view showing a conventional three-dimensionally structured transistor.
Figure 2:
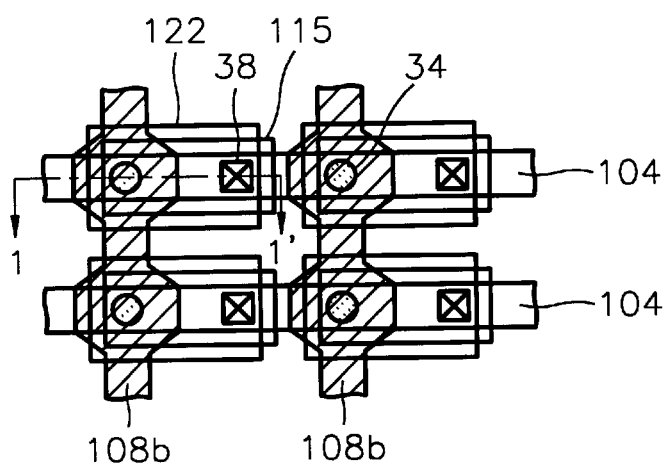
FIG. 2 is a plan view showing a three-dimensionally structured transistor of the present invention.

FIG. 2 is a plan view of a DRAM cell having a transistor structure according to the present invention, and shows the layout of the main components. Here, reference numeral 104 denotes a drain electrode, i.e., a bit-line arranged in parallel with a bit-lines, reference numeral 108b denotes a gate electrode, i.e., word-line arranged in parallel with word-lines and which is vertical to bit-line 104, reference numeral 34 denotes a portion where a drain region, a channel region and a source region are sequentially deposited on a portion of bit-line 104 which intersects with word-line 108b, reference numeral 115 denotes a source electrode connected to the source region, reference numeral 38 denotes a contact hole formed on source electrode 115, and reference numeral 122 denotes a storage electrode of a DRAM cell connected to source electrode 115 via contact hole 38.

Figure 3:
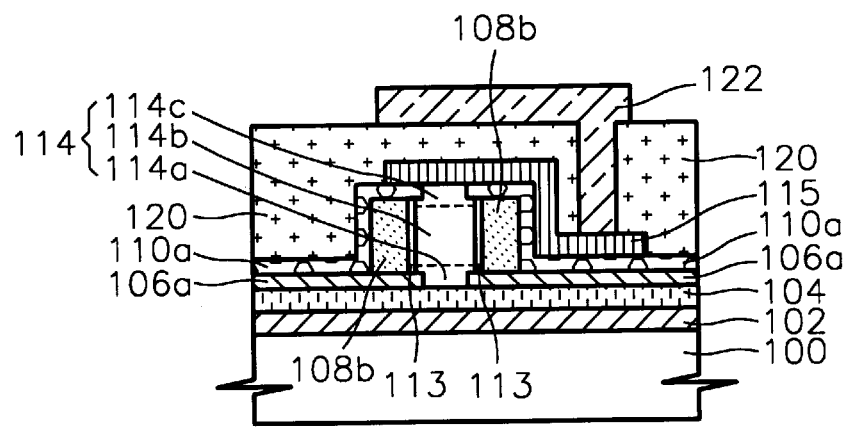
FIG. 3 is a section view showing the structure of the transistor of FIG. 2 taken along line AA.

FIG. 3 is a section view of the a transistor, taken along line AA' of FIG. 2. Here, reference numeral 100 denotes a semiconductor substrate, reference numerals 102 and 104 denote a first insulation layer and a first conductive layer sequentially formed on semiconductor substrate 100, respectively. As shown in FIG. 3, semiconductor substrate 100, first insulation layer 102, and first conductive layer 104 constitute a silicon-on-insulator (SOI) substrate structure. Here, first conductive layer 104 serves as the transistor's drain electrode or as a bit-line of the DRAM cell and may be formed of polysilicon, tungsten polycide, or other suitable material.

In FIG. 3, reference numeral 106a denotes a second insulation layer pattern formed on first conductive layer 104 with a first contact hole, which serves as a spacer formed at the drain side of a vertical transistor, reference numeral 108b denotes a gate electrode formed of a second conductive layer on the second insulation layer pattern 106a around the first contact hole, reference numeral 110a denotes a third insulation layer pattern formed on gate electrode 108b with a second contact hole having the same size as the first contact hole, which serves as a spacer formed at the source side of the vertical transistor. Here, the diameter of the hole formed by the gate electrode 108b is preferably greater than that of the first contact hole. Moreover, the gate electrode hole and the second contact hole are all located on the first contact hole, thereby exposing the first conductive layer 104 at the bottom of the first contact hole.

Also, reference numeral 113 denotes a cylindrical gate insulation layer formed of a fourth insulation layer pattern on the inner sidewalls of gate electrode 108b, and reference numeral 114 denotes a third conductive layer pattern in which a drain region 114a, a channel region 114b, and a source region 114c are sequentially deposited. The drain region 114a is formed as a first portion of the third conductive layer pattern 114 which contacts the exposed first conductive layer 104 within a first contact hole formed by second insulation layer pattern 106a. The channel region 114b is formed as a second portion of the third conductive layer pattern 114 which contacts the drain region 114a within a hole formed by cylindrical gate insulation layer 113. The source region 114c is formed as a third portion of the third conductive layer pattern 114 which contacts the channel region 114b within a second contact hole formed by third insulation layer pattern 110a. Reference numeral 115 denotes a source electrode formed as a fourth conductive layer pattern which contacts the source region 114c of third conductive layer pattern 114.

The three portions of third conductive layer pattern 114, i.e., a drain region 114a, a channel region 114b, and a source region 114c are preferably all formed of silicon grown by an epitaxial method, which is well known in the art. The drain, channel and source regions are each doped at the proper impurity concentration, wherein the channel region 114b is doped at the proper impurity concentration needed for controlling threshold voltage of a transistor, as is well Known in the art. Moreover, prior to forming the drain region 114a, a doped polysilicon layer having a thickness of about 500 angstroms is formed on the exposed first conductive layer 104, if necessary, in order to provide a material layer which serves as a seed in forming a drain region 114a of third conductive layer pattern 114 in an epitaxial growing method.

Also, reference numeral 120 denotes a fifth insulation layer pattern having a contact hole on fourth conductive layer pattern 115. Reference numeral 122 denotes a fifth conductive layer pattern connected to fourth conductive layer pattern 115 through the contact hole in fifth insulation layer 120. Here, fifth conductive layer pattern 122 is a storage electrode of a DRAM cell, which is connected to source electrode 115.

Now, a method for manufacturing the vertical transistor according to the present invention will be described.

FIGS. 4A to 4E are section views illustrating a method for manufacturing a transistor of the present invention. The reference numerals used in FIGS. 4A to 4E are the same as those used in FIG. 3.

Figure 4A:
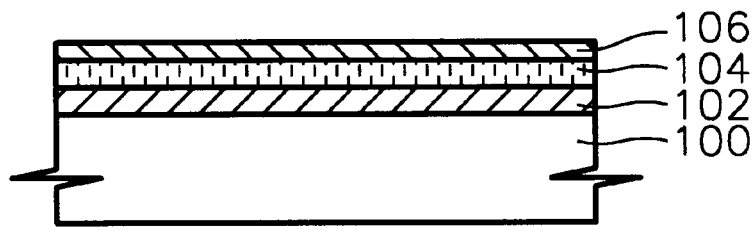
FIG. 4A to FIG. 4E are section views of the transistor of FIG. 2 illustrating a method for forming the transistor in accordance with an embodiment of the present invention, taken along line AA of FIG. 2.

FIG. 4A shows the step of forming a substrate having an SOI structure. First insulation layer 102, first conductive layer 104 and second insulation layer 106 are sequentially formed over semiconductor substrate 100. Here, first conductive layer 104, which may be formed of polysilicon, tungsten polycide, or other suitable material, becomes the drain electrode of a transistor of the present invention, and, in the case of a DRAM cell, it serves as a bit-line. The SOI structure includes the substrate 100 and layers 102 and 104. The first insulation layer 102 may be formed of a thermal oxide, CVD oxide, or a suitable material. The second insulation layer 106 may be formed of a CVD oxide or other suitable material.

Figure 4B:
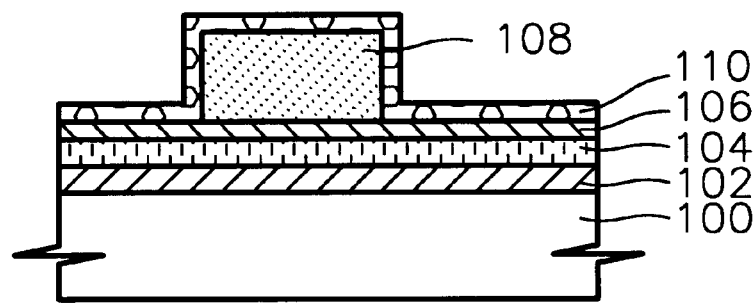

FIG. 4B shows forming second conductive layer pattern 108 and third insulation layer 110. Second conductive layer pattern 108 is formed on a predetermined region of second insulation layer 106. Then, third insulation layer 110 is formed on second insulation layer 106 and second conductive layer pattern 108. Second conductive layer 108 may be formed of doped polysilicon or a suitable material, and third insulation layer 110 may be formed of CVD oxide or a suitable material.

Figure 4C:
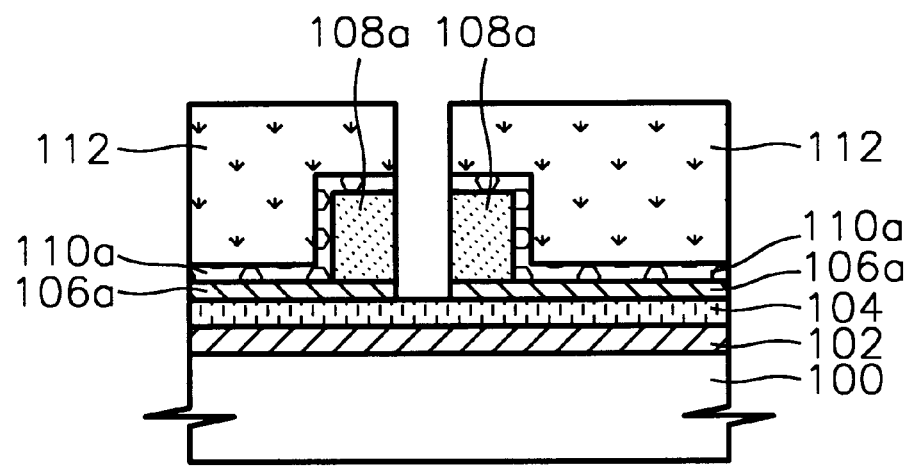

FIG. 4C shows the step of forming second insulation layer pattern 106a, second conductive layer pattern 108a and third insulation layer pattern 110a by forming a hole which runs through second insulation layer 106, second conductive layer 108, and third insulation layer 110, respectively. Photoresist pattern 112 is formed so that the portion of third insulation layer 110 at or near the center of second conductive layer pattern 108 is exposed. Third insulation layer 110, second conductive layer 108 and second insulation layer 106 are sequentially etched by using photoresist pattern 112 as an etching mask, to thereby form third insulation layer pattern 110a, second conductive layer pattern 108a and second insulation layer pattern 106a, each having a respective hole in accordance with photoresist pattern 112. Here, second insulation layer pattern 106a and third insulation layer pattern 110a respectively serve as spacers for the drain and source of a transistor, the gate electrode 108a from drain electrode 104 and source electrode 111(formed subsequently).

Figure 4D:
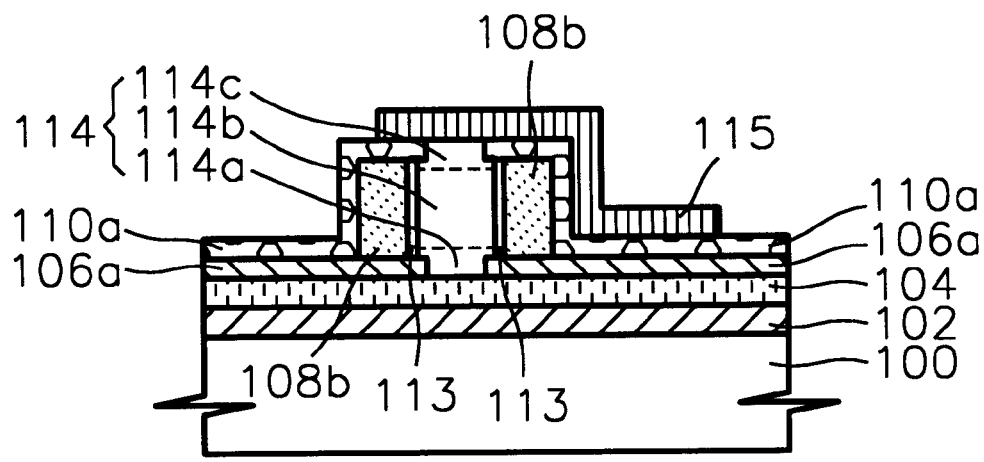

FIG. 4D shows the step of completing a transistor of the present invention. First, the sidewall of the second conductive layer pattern 108a is isotropically etched by a predetermined thickness to form gate electrode 108b. Then, photoresist pattern 112 is removed; however, the photoresist pattern 112 could be removed before performing the step of isotropically etching second conductive layer pattern 108a to form gate electrode 108b. Then, a fourth insulation layer, such as an oxide layer, which is preferably thinner than the thickness of second conductive layer pattern 108a that was removed by isotropic etching by a predetermined thickness, is formed over the semiconductor substrate 100 where photoresist pattern 112 had been removed. For example, this fourth insulation layer could be a thermal oxide.

Here, the fourth insulation layer is also formed on first conductive layer 104 exposed by the hole of second insulation layer pattern 106a. Without further etching, the fourth insulation layer deposited on first conductive layer 104 would prevent an electrical connection between a drain region to be formed in a subsequent process and first conductive layer 104 which forms a drain electrode. Accordingly, the fourth insulation layer is anisotropically etched to remove the fourth insulation layer from the first conductive layer 104, thereby exposing first conductive layer 104, while allowing the fourth insulation layer to remain on an inner wall of gate electrode 108b, thereby forming cylindrical gate insulation layer 113. Here, if third insulation layer pattern 110a and the fourth insulation layer are formed of the same material, for example, an oxide, a part of third insulation layer pattern 110a may be etched when the fourth insulation layer is anisotropically etched, and this should be taken into consideration in determining the thickness of the third insulation layer when it is formed.

Subsequently, third conductive layer pattern 114 is formed in a hole surrounded by second insulation layer 106a, gate insulation layer 113 and third insulation layer pattern 110a. Here, third conductive layer pattern 114 consists of three portions, i.e., a drain region, a channel region and a source region of the transistor of the present invention, which are all preferably formed of a silicon layer sequentially grown by an epitaxial method. In more detail, the first portion of third conductive layer pattern 114, i.e., a drain region 114a, that contacts the exposed first conductive layer 104, is formed in the hole of second insulation layer pattern 106a by growing an epitaxial layer having the impurity concentration of a lightly doped drain ("LDD") region or a higher concentration. Then, the second portion of third conductive layer pattern 114, i.e., a channel region 114b that contacts the drain region 114a, is formed in a hole formed by gate insulation layer 113 by growing a silicon layer by an epitaxial method. Next, the third portion of third conductive layer 114, i.e., a source region 114c, that contacts the channel region 114b and has the same or similar impurity concentration as the drain region 114a, is formed in a hole of third insulation layer pattern 110a by growing a silicon layer by an epitaxial method. Preferably, the drain region 114a extends above the level of the lower surface of gate electrode 108b, and the source region 114c extends below the level of the upper surface of gate electrode 108b.

Third conductive layer pattern 114 is preferably formed from epitaxial silicon, which can be achieved by using vapor phase epitaxy (VPE), liquid phase epitaxy (LPE), solid phase epitaxy (SPE), or other suitable processes. For silicon processing, VPE has met with the widest acceptance, since excellent control of the impurity concentration and crystalline perfection can be realized.

The doping concentration of the drain, source, and channel regions may be controlled by adding the proper dopant amount to the reaction gas (i.e., the silicon source gas such as silane, dichlorosilane, or trichlorosilane) at the appropriate steps throughout the growth process. Here, the dopants are introduced using their hydrides; for example, diborane ($B_2H_6$) gas for boron, phosphine ($PH_3$) gas for phosphorous, and arsine ($AsH_3$) gas for arsenic. The typical doping concentrations of the source/drain regions are approximately $10^{15}$ to $10^{17}$ atoms/cm$^3$ for a LDD structure, and $10^{19}$ to $10^{21}$ atoms/cm$^3$ for a normal structure, although these concentrations may be varied. The doping concentration of the channel region, however, affects a transistor's threshold voltage and is dependent on the thickness of gate insulation layer 113, as is well-known in the art.

Then, a fourth conductive layer is formed all over the semiconductor substrate 100 where the source region 114c is formed. The fourth conductive layer may be formed of doped polysilicon or a suitable material. Then, the resultant structure is patterned so as to form fourth conductive layer pattern 115 which serves as a source electrode to contact the source region 114c. Thus, the three-dimensionally structured transistor of the present invention can be completed.

Figure 4E:
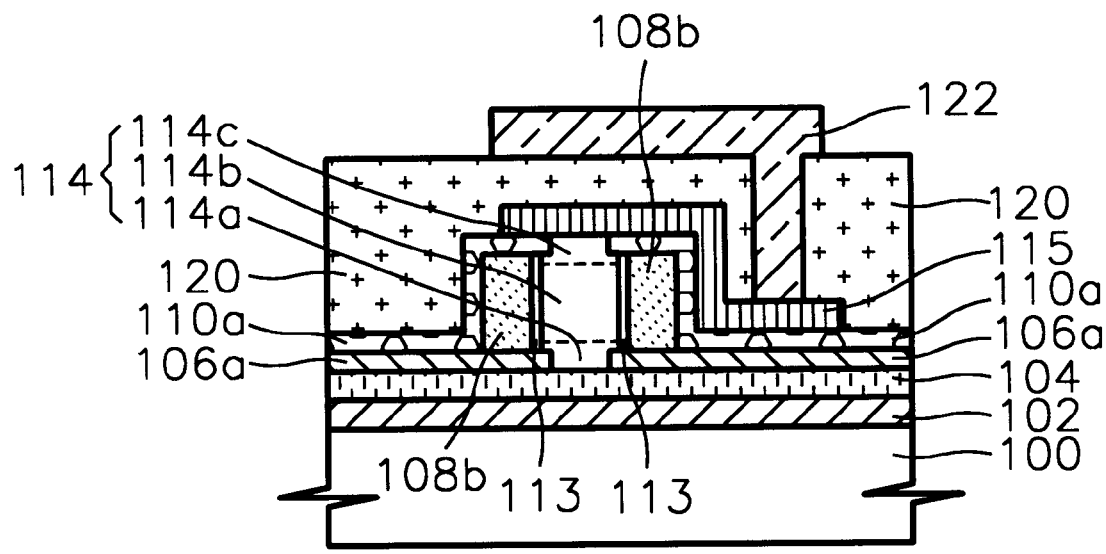

FIG. 4E is a section view of a DRAM cell that includes the transistor of the present invention. In more detail, a fifth insulation layer is formed on the transistor completed in FIG. 4D. Then, fifth insulation layer pattern 120 is formed by creating a contact hole the fifth insulation layer to expose a portion of the fourth conductive layer pattern 115. Then, fifth conductive layer pattern 122 is formed over fifth insulation pattern 120 and is connected to fourth conductive layer pattern 115 through the contact hole. The fifth insulation layer pattern 120 may be formed of borophosphosilicate glass (BPSG) or a suitable material. The fifth conductive layer 122 may be a doped polysilicon or another suitable material. Here, fifth conductive layer 122 serves as a storage electrode of the DRAM cell.

According to an embodiment of the present invention, a three-dimensionally structured transistor is formed without a trench process, enhancing device integration and prevent a characteristic degradation caused by leakage current. In addition, contact holes for connecting source/drain electrodes to source/drain regions are formed simultaneously with the hole for the source/drain regions. Therefore, self-aligned contacts can be formed, which enables the improvement of process margin. In addition, the transistor may be formed on an SOI substrate structure. Thus, the latch-up phenomenon encountered in a typical CMOS transistor can be eliminated. Moreover, there is no need for an isolation process for separating the devices or an associated well formation process which simplifies the process and curtails cost.

It is further understood by those skilled in the art that the foregoing description is a preferred embodiment of the disclosed device and that various changes and modifications may be made in the invention without departing from the spirit and scope thereof.

What is claimed is:

1. A vertical transistor comprising:
    a first insulation layer overlying a semiconductor substrate;
    a first conductive layer overlying said first insulation layer:
    a second insulation layer pattern overlying said first conductive layer, said second insulation layer pattern having a first contact hole;
    a gate electrode comprising a second conductive layer overlying said second insulation layer pattern, said gate electrode having a hole which is concentric with and has a diameter larger than said first contact hole, thereby exposing said first conductive layer at the bottom of said contact hole;
    a third insulation layer pattern overlying said gate electrode, said third insulation layer pattern having a second contact hole which is concentric with and approximately the same size as said first contact hole;
    gate insulation comprising a fourth insulation layer, said gate insulation formed on an inner sidewall of said gate electrode hole, thereby forming a gate insulation hole;
    a third conductive layer pattern filling each of said first contact hole, said second contact hole, and said gate insulation hole, said third conductive layer pattern having a drain region, a source region, and a channel region positioned between said drain and source regions;
    said drain region formed substantially in said first contact hole and connected to said first conductive layer;
    said source region formed substantially in said second contact hole and connected to a source electrode, said source electrode consisting of a fourth conductive layer formed on said third insulation layer pattern and on said second contact hole; and
    said channel region formed substantially in said gate insulation hole between said source and drain regions.

2. A vertical transistor according to claim 1, wherein said drain region and said source region extend into said gate insulation hole.

3. A vertical transistor according to claim 1, wherein said drain region and said source region do not extend into said gate insulation hole.

4. A vertical transistor according to claim 1, wherein one of said drain region and said source region extends into said gate insulation hole.

5. A vertical transistor according to claim 1, wherein said source region is formed in said gate insulation hole and connected to said fourth conductive layer through said second contact hole.

6. A vertical transistor according to claim 1, wherein said first conductive layer is formed of a material selected from a group consisting of polysilicon and a tungsten polycide.

7. A vertical transistor according to claim 1, wherein said drain region, said channel region and said source region are formed of an epitaxial silicon layer.

8. The vertical transistor of claim 1, wherein said semiconductor substrate has a substantially flat top surface, and said first insulation layer and said first conductive layer are parallel to said top surface.

9. A memory cell comprising:
    a first insulation layer and a first conductive layer sequentially formed on a semiconductor substrate;
    a second insulation layer pattern formed on said first conductive layer, said second insulation layer pattern having a first contact hole;
    a gate electrode comprising a second conductive layer formed above said second insulation layer pattern, said gate electrode having a hole which is concentric with and has a larger diameter than said first contact hole, thereby exposing said first conductive layer at the bottom of said first contact hole;
    a third insulation layer pattern formed on said gate electrode, said third insulation layer pattern having a second contact hole which is concentric with and approximately the same size as said first contact hole, said second contact hole having an inner sidewall;
    gate insulation comprising a fourth insulation layer, said gate insulation formed on an inner sidewall of said gate electrode hole, thereby forming a gate insulation hole;
    a third conductive layer pattern filling each of said first contact hole, said second contact hole, and said gate insulation hole, said third conductive layer pattern having a drain region, a source region, and a channel region positioned between said drain and source regions;

said drain region formed substantially in said first contact hole and connected to said first conductive layer;

said source region formed substantially in said second contact hole and connected to a source electrode, said source electrode consisting of a fourth conductive layer formed on said third insulation layer pattern and on said second contact hole;

said channel region formed substantially in said gate insulation hole between said source and drain regions;

a fifth insulation layer pattern formed on said third insulation layer pattern and said source electrode, said fifth insulation layer pattern having a contact hole to said source electrode; and a storage electrode consisting of a fifth conductive layer pattern formed on said fifth insulation layer pattern and on said contact hole to said source electrode, said storage electrode connected to said source electrode through said contact hole.

10. A memory cell according to claim 9, wherein said drain region and said source region extend into said gate insulation hole.

11. A memory cell according to claim 9, wherein said drain region and said source region do not extend into said gate insulation hole.

12. A memory cell according to claim 9, wherein one of said drain region and said source region extends into said gate insulation hole.

13. A memory cell according to claim 9, wherein said source region is formed in said gate insulation hole and connected to said fourth conductive layer through said second contact hole.

14. A memory cell according to claim 9, wherein said first conductive layer is formed of a material selected from a group consisting of polysilicon and a tungsten polycide.

15. A memory cell according to claim 9, wherein said drain region, said channel region and said source region are formed of an epitaxial silicon layer.

16. A memory cell according to claim 9, wherein said fifth insulation layer pattern is formed of borophosphosilicate glass.

* * * * *